(12) United States Patent
Visani et al.

(10) Patent No.: US 10,291,437 B1
(45) Date of Patent: May 14, 2019

(54) SYSTEMS AND METHODS FOR MEASURING IMPULSE RESPONSES IN A DIGITAL COMMUNICATION SYSTEM

(71) Applicant: Marvell International Ltd., Hamilton (BM)

(72) Inventors: Davide Visani, San Jose, CA (US); Luca Vercesi, Pavia (IT); Fernando De Bernardinis, Pavia (IT)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/975,288

(22) Filed: May 9, 2018

(51) Int. Cl.
| | | |
|---|---|---|
| *H04L 5/00* | (2006.01) | |
| *H04L 25/02* | (2006.01) | |
| *H03M 1/12* | (2006.01) | |
| *H04L 25/03* | (2006.01) | |

(52) U.S. Cl.
CPC .......... *H04L 25/0212* (2013.01); *H03M 1/12* (2013.01); *H04L 5/0007* (2013.01); *H04L 25/024* (2013.01); *H04L 25/03292* (2013.01); *H04L 2025/03356* (2013.01)

(58) Field of Classification Search
USPC .......... 375/340, 341; 370/252, 208
See application file for complete search history.

(56) References Cited

U.S. PATENT DOCUMENTS

| | | | | |
|---|---|---|---|---|
| 5,432,821 | A * | 7/1995 | Polydoros | ......... H04L 25/03337 375/340 |
| 7,782,753 | B2 * | 8/2010 | Cheng | ................. H04L 27/2601 370/208 |
| 8,199,861 | B1 * | 6/2012 | Karkhanechi | ................. 375/340 |
| 2003/0108127 | A1 * | 6/2003 | Eilts | .................... H04L 25/0212 375/340 |
| 2006/0256896 | A1 * | 11/2006 | Venkataramani | ......... H03L 7/00 375/341 |
| 2014/0286185 | A1 * | 9/2014 | Liu | ................... H04L 25/03968 370/252 |
| 2017/0180063 | A1 * | 6/2017 | Berscheid | ............... H04L 27/26 |

\* cited by examiner

*Primary Examiner* — Eva Y Puente

(57) ABSTRACT

Embodiments described herein include methods and systems for measuring channel impulse responses in a digital communication system. Specifically, statistical properties of the received signals at the receiver of the digital communication system are analyzed to compute, in real time, channel coefficients indicative of the channel state information, which may be time-dependent, without the use of a training signal.

20 Claims, 6 Drawing Sheets

SYSTEMS AND METHODS FOR MEASURING IMPULSE RESPONSES IN A DIGITAL COMMUNICATION SYSTEM

FIELD OF USE

This disclosure relates to signal processing at a receiver in a digital communication system, and specifically, to systems and methods for measuring impulse responses in a digital communication system.

BACKGROUND OF THE DISCLOSURES

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

A wireless digital communication system typically includes a transmitter that converts digital data samples into an analog signal, which in turn is modulated or encoded onto a carrier signal for transmission via a wireless channel to a receiver. The receiver receives an analog signal from the wireless channel, and recovers the transmitted data samples from the received signal, i.e., by demodulating or decoding the received analog signal and converting the analog signal to digital samples. In order to recover the transmitted data samples from a received signal, channel state information that is indicative of a combined effect of scattering, fading and power decay with distance to the transmitted signal is usually needed. Conventional systems typically use a training sequence, whose sequence composition is known to the receiver such that the receiver can generate the channel state information by comparing the recovered data sequence from the received signal and the known training sequence. The generation of the channel state information based on transmitting a training sequence is usually performed before transmitting any payload data. Thus, when the channel varies over time, the training sequence needs to be re-transmitted periodically, or intermittently to re-calibrate the channel at the receiver. The periodic channel re-calibration with training sequences usually causes transmission latency for the payload data, and also negatively affects the network throughput performance.

SUMMARY

Embodiments described herein provide a network device configured to estimate a transmission attribute of a wired communications channel based on statistical properties of received data signals, without a specific training sequence. The network device includes a receiver, a sampler, computing circuitry and a data recovery circuit. The receiver is configured to receive, from a transmission channel, an analog data signal. The sampler is configured to sample the received analog data signal to generate a plurality of data samples corresponding to a respective plurality of time instances. The computing circuitry is configured to determine whether a given data sample from among the plurality of data samples satisfies a condition. The condition is that a transmitted data sample corresponding to the given data sample, when delayed by a pre-defined time delay, equals a pre-defined value. When the given data sample satisfies the condition, the computing circuitry is configured to add the given data sample into a subset of the plurality of data samples. The computing circuitry is further configured to compute a mean average of the subset of the plurality of data samples as a conditional average of the plurality of data samples and compute a channel impulse response at a time relating to the pre-defined time delay based on the computed conditional average and the pre-defined value. The data recovery circuit is configured to recover a plurality of transmitted data samples from the plurality of data samples based at least in part on the computed channel impulse response.

In some implementations, the network device includes an analog-to-digital converter (ADC) configured to convert the plurality of data samples into a digital data signal. The data recovery circuit is configured to recover the plurality of transmitted data samples from the digital data signal using the computed channel impulse response. The computing circuitry, when determining whether the transmitted data sample corresponding to the given data sample from among the plurality of data samples satisfies the condition, is further configured to obtain, from the data recovery circuit, a plurality of previously recovered transmitted data samples prior to a current time instance. The computing circuitry is further configured to identify, from the plurality of previously recovered transmitted data samples, the transmitted data sample having a same time instance with the given data sample, and obtain, from the plurality of previously recovered transmitted data samples, a delayed transmitted data sample that is delayed by a pre-defined time delay from the transmitted data sample. The computing circuitry is configured to determine whether the delayed transmitted data sample equals the pre-defined value.

In some implementations, the network device further includes a first slicer. The first slicer is configured to, for each data sample from the plurality of data samples, compare a magnitude of the respective data sample with a first threshold value, output a first respective slicer value of one when the magnitude of the respective data sample is greater than the first threshold value, and output the first respective slicer value of zero when the magnitude of the respective data sample is less than the first threshold value. The computing circuitry includes an analog serializer/deserializer (SerDes) circuit configured to obtain, from the data recovery circuit, a plurality of previously recovered transmitted data samples prior to a current time instance, and select a first subset of a first plurality of slicer values outputted from the first slicer based on the plurality of previously recovered transmitted data samples prior to a current time instance. Each slicer value from the first subset corresponds to a respective time instance, and a respective transmitted sample at a time delayed by the pre-defined time delay relative to the respective time instance equals the pre-defined value. The SerDes circuitry is further configured to compute a first average of the first subset of the plurality of slicer values.

In some implementations, the first slicer is configured to receive the computed first average from the computing circuitry via a feedback loop, and adjust the first threshold value until the computed first average equals a value of 0.5. The computing circuitry is configured to compute the channel impulse response at the time relating to the pre-defined time delay by dividing the adjusted first threshold by the pre-defined value.

In some implementations, the network device further includes a second slicer, disposed in parallel to the first slicer. The second slicer is configured to, for each data sample from the plurality of data samples, compare the magnitude of the respective data sample with a second threshold value, output a second respective slicer value of one when the magnitude of the respective data sample is greater than the second threshold value, and output the second respective slicer value of zero when the magnitude of the respective data sample is less than the second threshold value. The computing circuitry, when computing the conditional average of the plurality of data samples, is further configured to select a second subset of a plurality of slicer values outputted from the second slicer based on the plurality of previously recovered transmitted data samples prior to the current time instance. Each slicer value from the second subset corresponds to the respective time instance, and a respective transmitted sample at a time delayed by the pre-defined time delay relative to the respective time instance equals an opposite of the pre-defined value. The computing circuitry is further configured to compute a second average of the second subset of the plurality of slicer values.

In some implementations, the first slicer is configured to receive the computed first average from the computing circuitry via a first feedback loop, and adjust the first threshold until the computed first average equals a probability value less than one. The second slicer is configured to receive the computed second average from the computing circuitry via a second feedback loop, and adjust the second threshold until the computed second average equals the probability value. The computing circuitry is further configured to compute a difference between the adjusted first threshold and the adjusted second threshold, and compute the channel impulse response at the time relating to the pre-defined time delay by dividing the computed difference by the pre-defined value.

In some implementations, the network device further includes a slicer configured to for a first subset of data samples from the plurality of data samples, output a first respective slicer value of one when the magnitude of a first respective data sample is greater than the first threshold value, and output the first respective slicer value of zero when the magnitude of the first respective data sample is less than the first threshold value. The slicer is configured to for a second subset of data samples from the plurality of data samples, output a second respective slicer value of one when the magnitude of a second respective data sample is greater than the second threshold value, and output the first respective slicer value of zero when the magnitude of the second respective data sample is less than the second threshold value. The network device further includes a de-multiplexer connected to the slicer. The de-multiplexer is configured to demultiplex an output from the slicer into a first output of slicer values generated from the first subset of data samples, and a second output of slicer values generated from the second subset of data samples. The computing circuitry is configured to compute a first conditional average of the first output of slicer values given a first condition is met, and to compute a second conditional average of the second output of the slicer values given a second condition is met. The first condition is that for a first given data sample from the first subset of data samples, a first transmitted data sample corresponding to the first given data sample, when delayed by the pre-defined time delay, equals the pre-defined value. The second condition is that for a second given data sample from the second subset of data samples, a second transmitted data sample corresponding to the second given data sample, when delayed by the pre-defined time delay, equals an opposite of the pre-defined value.

In some implementations, the computing circuitry is further configured to adjust the first threshold and the second threshold via a feedback loop to the slicer until the computed first conditional average and the second conditional average are equivalent to a probability value, compute a difference between the first threshold and the second threshold when the computed first conditional average and the second conditional average are equivalent to the probability value, and compute the channel impulse response based on the computed difference.

In some implementations, the sampler is configured to sample the received data signal at a sampling time point within a sampling period. The computed channel impulse response corresponds to the sampling time.

In some implementations, the sampler is configured to sample the received data signal at a set of different sampling times, each sampling time from the set of different sampling times corresponding to a different time point within a sampling period. The computing circuitry is further configured to compute a set of different channel impulse responses corresponding to different sampling times based on data samples obtained at the set of different sampling times.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

Figure 1:
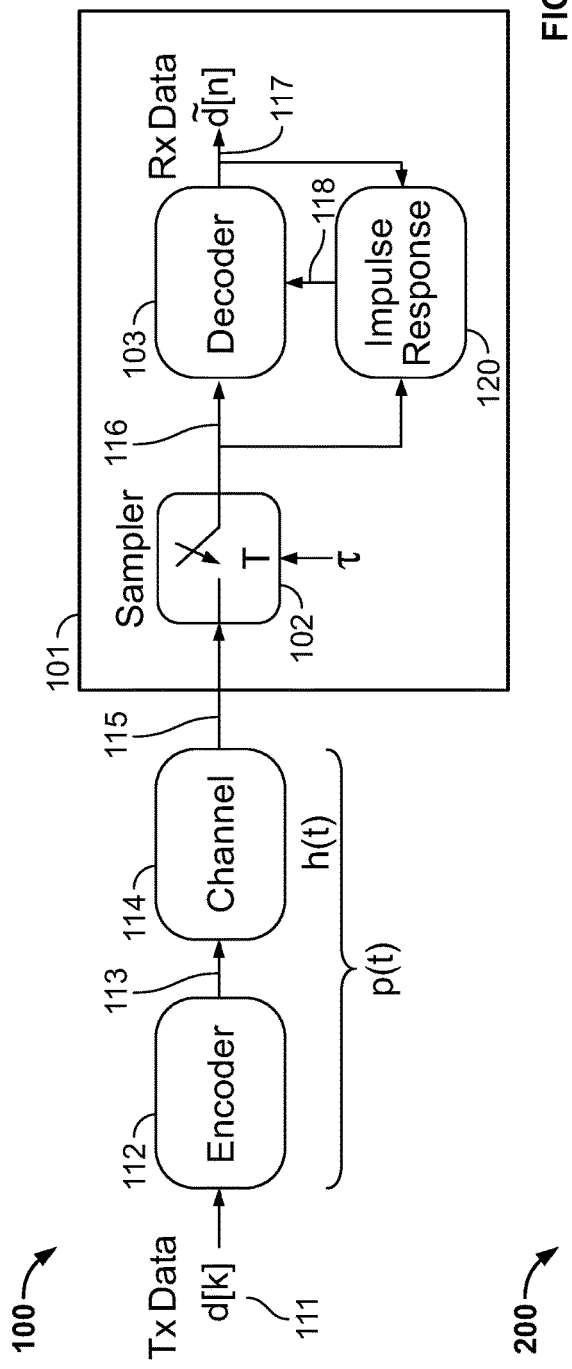
FIG. 1 is an example block diagram illustrating a network device having a component to measure a channel impulse response based on statistical properties of digital data samples of the received signal, according to embodiments described herein.

This disclosure describes methods and systems for measuring channel impulse responses in a digital communication system. Specifically, statistical properties of the received signals at the receiver of the digital communication system are analyzed to compute, in real time, channel coefficients indicative of the channel state information, which may be time-dependent, without the use of a training signal.

For example, in a communication system, the transmission channel typically is mathematically represented as a time-varying function h(t), which is applied to the transmitted signal. The channel state information is usually a result of a combined effect of scattering, fading and power decay with distance when the transmitted signal propagates from the transmitter to the receiver, e.g., the function h(t) is indicative of an effect to the transmitted signal. Thus, to recover the transmitted signal from a received signal at the receiver, the state information of the channel, e.g., known as the channel estimate or a channel impulse response h(t), is usually required. Traditionally, the channel impulse response can be measured by sending a training sequence to the receiver. As the receiver has knowledge of the composition of the training sequence, the channel impulse response can be computed based on the received data sequence and the actual transmitted training sequence. However, by using the training sequence, a delay of the channel condition estimation can be expected. Moreover, the channel cannot be re-calibrated in real time, as the training sequence needs to be repeatedly sent in order to re-calibrate the channel.

Instead of using training sequences that consume transmission resources, embodiments described herein provide measurement of the channel impulse response of a high-speed digital link by computing an approximated conditional expectation of the received data samples when a condition relating to the recovered transmitted data samples is met, and in turn recovering a channel impulse response at a certain time from the approximated conditional expectation based on statistical properties of the received data samples, as further described below in relation to FIGS. 1-7. In this way, the channel can be calibrated in real time based on data samples that are generated from a received signal at the receiver, without using a training sequence.

As used herein, the term "conditional expectation" is referred to an expected value of a random variable given that a certain condition is satisfied. For example, a conditional expectation $E[r[n]|d[n-m]=\bar{d}]$ indicates an expected value of a received data sample r[n] at the time instance n given that the condition of a corresponding transmitted data sample, when delayed by a time delay of m, e.g., d[n-m], being equivalent to the value of $\bar{d}$ is met. As used herein, the term "conditional average" of a plurality of data samples refers to a mean average of a subset of the plurality of data samples, wherein each data sample from the subset satisfies a certain condition.

As used herein, the term "r[n]" is referred to as a received data sample at a discrete time instance n; the term "d[n]" is referred to as an originally transmitted data sample at the discrete time instance n; the term "m" is referred to as discrete time delay; the term "i" is referred to as a sampling time point; the term "T" is referred to as a sampling period; the term "x" is referred to as a threshold value of a data slicer; and the function "p(t)" is referred to as a channel response at the time t. Various other notations are introduced throughout the application.

FIG. 1 is an example block diagram 100 illustrating a network device having a component 120 configured to measure a channel impulse response based on statistical properties of the received signal, according to embodiments described herein. In a communication system, data symbols 111, e.g., represented by d[k] where k indicates a time instance associated with the data symbol d[k], are encoded at an encoder 112 of a transmitter before being sent to a transmission channel 114. The encoded data signal 113 is then transmitted on a transmission channel 114, e.g., the channel function h(t) is applied to the encoded data signal 113. When the transmitted data symbol 111 is an impulse signal, the response signal after the encoder and channel transformation is equivalent to the joint transformation of the encoder 112 and the channel function h(t), represented by p(t). Therefore, p(t) is referred to herein as the channel impulse response or channel estimate at time t throughout the application.

A receiver network device 101 is configured to receive the transmitted signal 115 from the transmission channel 114 (e.g., a wireless medium), wherein the transmitted signal 115 is represented as $$r(t) = \sum_{k=-\infty}^{\infty} d(k) \cdot p(t - kT)$$

wherein p( ) represents channel impulse response, and T represents the sampling period of sampler 102. At the network device 101, the sampler 102 is configured to sample the received signal r(t) 115 with a sampling period T and a (optional) sampling time point r. The sampled data signal 116 is represented as:

$$r[n] = \sum_{k=-\infty}^{\infty} d(k) \cdot p(nT + \tau - kT)$$

The network device 101 is configured to recover the original transmitted data d[k] and thus need to obtain an estimate of the channel impulse response p(t).

An impulse response estimation module 120 is configured to utilize statistical properties of the sampled signal r[n] 116 to generate an approximate value for the channel impulse response p(t). Specifically, under the hypothesis that uncorrelated random data (e.g., the received sampled signal r[n]) generally has a zero mean, the expectation of the received signal is zero, e.g., $$E[r[n]] = E\left[\sum_{k=-\infty}^{\infty} d(k) \cdot p(nT + \tau - kT)\right] = 0$$

wherein, as noted above, r[n] represents the sampled received signal at a discrete time n; d(k) represents the transmitted data sample at a discrete time k; τ represents an optional sampling time point; and T represents the sampling period. However, if conditioning on one of the received data samples, the conditional expectation provides a sampled value of the channel impulse response p( ), e.g., $$E[r[n] | d[n-m] = \bar{d}] =$$
$$E\left[\sum_{k=-\infty}^{\infty} d(k) \cdot p(nT + \tau - kT)\right] + \bar{d} \cdot p(\tau + mT) = \bar{d} \cdot p(\tau + mT)$$

wherein m represents a distance in the time axis between a conditioned data sample and a current data sample; and $\bar{d}$ is a pre-selected value of the transmitted data sample. Thus, based on the above computation of the conditional expectation of r[n], the channel impulse response p(τ+mT) can be computed from the conditional expectation above, which in turn can be approximated by computing a conditional average value of the received data samples r[n] 116 from the sampler 102. The conditional average is computed based on the same condition in the conditional expectation of r[n], i.e., that d[n−m]=$\bar{d}$, the transmitted data sample, when delayed by a "distance" of m in the time axis, equals a pre-defined or pre-selected value of $\bar{d}$. The condition can be measured by the impulse response estimation module 120 by receiving decoded data samples $\tilde{d}$[n] 117 from the decoder 103. For example, the decoder 103 is a data recovery circuit that transforms received data to a different form that corresponds to the originally transmitted data based on a transformation matrix. In some embodiments, the selection of the conditioned data sample value $\bar{d}$ can be varied to obtain different estimates of the channel impulse response. Further implementations of computing the conditional average of the sampled signal are discussed in FIGS. 2-5. In this way, by measuring an approximated value of the conditional expectation E[r[n]|d[n−m]=$\bar{d}$], the network device 101 is configured to calibrate the channel 114 at the same time when data signals 115 that represent actual data payload are received in real time from the channel 114, without transmitting any training sequence The channel estimate 118 is then passed to the decoder 103, which in turn decodes, using the channel estimate 118, the received data samples 116 to generate recovered data $\tilde{d}$[n]. As described above, the recovered data samples $\tilde{d}$[n] (with a delay of m) is sent back to the impulse response estimation module 120 for calibrating the channel estimate based on a conditional average of the sampled data signal 116.

Figure 2:
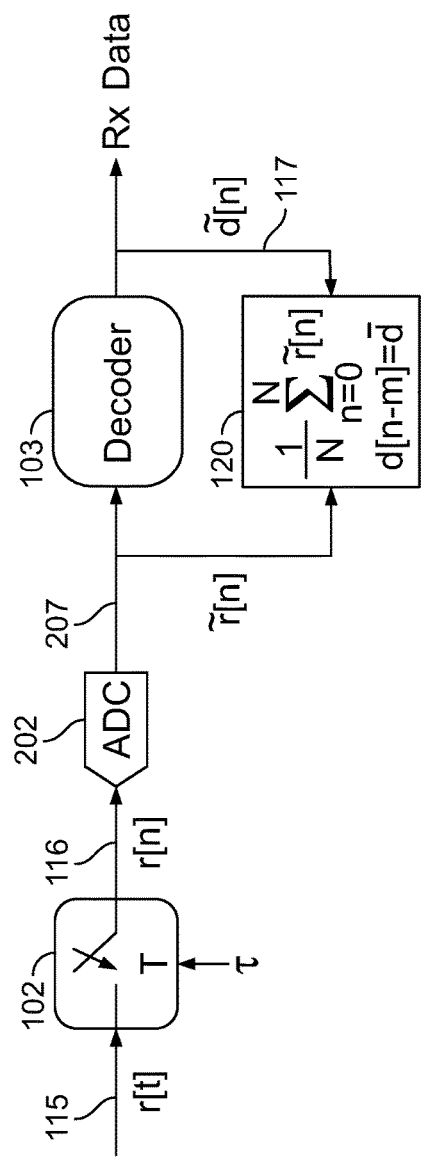
FIG. 2 is an example block diagram illustrating a digital implementation of the network device receiver shown in FIG. 1, including an analog-to-digital converter (ADC) based network device configured to measure a channel impulse response, according to embodiments described herein.

FIG. 2 provides an example block diagram 200 illustrating a digital implementation of the network device 101 in FIG. 1, including an analog-to-digital converter (ADC) based network device (e.g., network device 101 in FIG. 1) configured to measure a channel impulse response, according to embodiments described herein. Similar to diagram 100, at a network device, received data signal 115 is sampled by the sampler 102 into a plurality of received samples 116. An ADC 202 is configured to convert the samples r[n] to digital signals 207 $\tilde{r}$[n]. The impulse response estimation module 120 is then configured to compute a conditional average of the digital signal 207 $\tilde{r}$[n] to approximate a conditional expectation of the received signal r(t) 115 given the condition that d[n−m]=$\bar{d}$ is met.

For example, assuming the received signal r(t) representing an ergodic process, then the temporal average of data samples of the ergodic process is a measure of the expectation when the number of samples is sufficiently large, e.g., $$\frac{1}{N} \sum_{\substack{n=0 \\ d[n-m]=\bar{d}}}^{N} r[n] \xrightarrow{N \to \infty} E[r[n] \mid d[n-m] = \bar{d}]$$

wherein N represents the number of data samples r[n]. The conditional average $$\frac{1}{N} \sum_{\substack{n=0 \\ d[n-m]=\bar{d}}}^{N} r[n]$$

of the received data samples can be computed via an ADC-based SerDes device. For example, the impulse response estimation module 120 employs a digital SerDes circuit to receive the digital signal 207 $\tilde{r}$[n] that is used to represent r[n] from the ADC 202, and the decoded signal 117 $\tilde{d}$[n] that is used to represent d[n] from the decoder 103 to compute a conditional average $$\frac{1}{N} \sum_{\substack{n=0 \\ d[n-m]=\bar{d}}}^{N} r[n].$$

Specifically, to compute the conditional average $$\frac{1}{N} \sum_{\substack{n=0 \\ d[n-m]=\bar{d}}}^{N} r[n],$$

the impulse response estimation module 120 is configured to determine whether a given data sample r[n], from among the plurality of data samples {r[n], n=0, . . . , N}, satisfies the condition d[n−m]=$\bar{d}$. The condition requires that a transmitted data sample d[n] corresponding to the given data sample r[n], when delayed by a pre-defined time delay of m, e.g., d[n−m], equals a pre-defined value of $\bar{d}$. To examine whether the condition is met, the impulse response estimation module 120 is configured to obtain, from the decoder 103, a plurality of previously recovered transmitted data samples {$\tilde{d}$[k], k=0, 1, 2, . . . n} prior to a current time instance n. The impulse response estimation module 120 is then configured to identify, from the plurality of previously recovered transmitted data samples {$\tilde{d}$[k], k=0, 1, 2, . . . n} that are used as the equivalent of the actual transmitted data samples {d[k], k=0, 1, 2, . . . n}, the transmitted data sample d[n] having a same time instance n with the given data sample r[n]. The impulse response estimation module 120 is then configured to obtain a delayed transmitted data sample d[n−m] that is delayed by a pre-defined time delay m from the transmitted data sample d[n], and determine whether the delayed transmitted data sample d[n−m] equals the pre-defined value $\bar{d}$. When the given data sample r[n] satisfies the condition, the impulse response estimation module 120 is configured to add the given data sample r[n] into a subset of the plurality of data samples, and then compute a mean average of the subset of the plurality of data samples as a conditional average of the plurality of data samples $$\frac{1}{N} \sum_{\substack{n=0 \\ d[n-m]=\bar{d}}}^{N} r[n].$$

When the number N is sufficiently large (e.g., 10000, 50000, etc.), the conditional average approximates the value of the conditional expectation E[r[n]|d[n−m]=$\bar{d}$], which in turn equals the value of $\bar{d}$·p(τ+mT) as discussed above. The impulse response estimation module 120 is then configured to divide the computed conditional average by the value of the conditioned data sample $\bar{d}$ to obtain a value of the channel estimate p(τ+mT).

In some embodiments, the impulse response estimation module 120 is configured to periodically, intermittently or constantly take different data samples of the digital signal 207 $\tilde{r}$[n], and re-compute a channel estimate p(τ+mT) so as to use the most up-to-date channel information to decode the received signal in real time.

Figure 3:
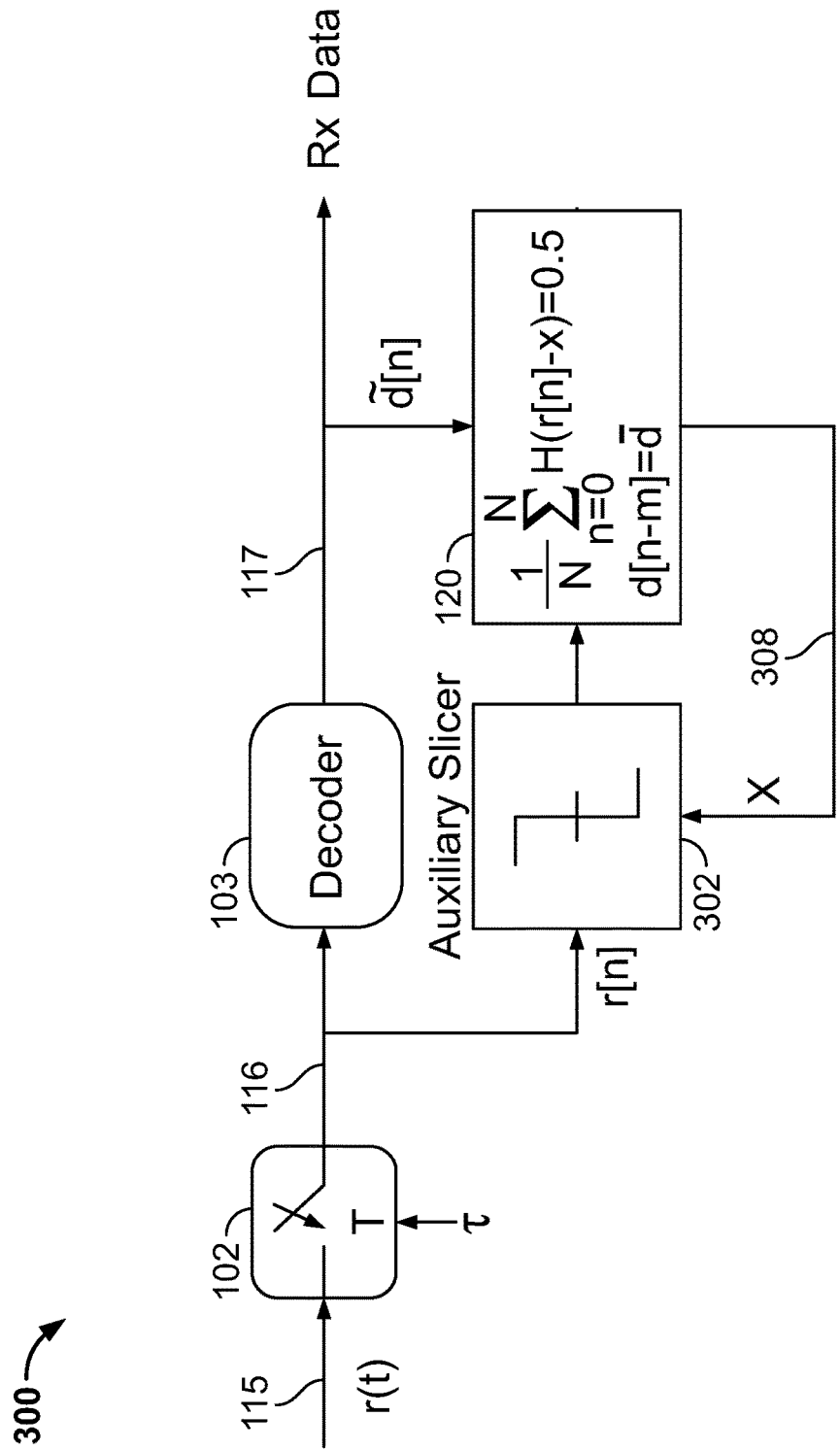
FIG. 3 is an example block diagram illustrating an analog SerDes implementation of the network device receiver shown in FIG. 1, to measure a channel impulse response, according to embodiments described herein.

FIG. 3 provides an example block diagram 300 illustrating an analog SerDes implementation for a network device (e.g., network device 101 in FIG. 1) to measure a channel impulse response, according to embodiments described herein. When the impulse response estimation module 120 employs an analog SerDes that is configured to operate on analog data samples to compute a conditional average of the analog data samples, additional analog hardware is implemented at the network device along with the impulse response estimation module 120. For example, a data slicer 302 is employed to receive the data samples 116 from the sampler 102. The data slicer 302 has a structure similar to a comparator with a programmable threshold, which is configured to generate an output of one if the input data sample 116 is greater than the programmed threshold, and generate an output of zero if the input data sample 116 is less than the programmed threshold. In this way, the data samples 116 are "sliced" by the slicer 302.

The slicer 302 is used to obtain a step value of H(r[n]−x), i.e., H(r[n]−x)=1 when r[n]≥x; and H(r[n]−x)=0 when r[n]<x. The step value H(r[n]−x) can be used to determine the cumulative distribution function (CDF) of the received signal r(t), and thus is used to approximate the conditional expectation of r(t), e.g., $$E[H(r[n]-x) \mid d[n-m] = \bar{d}] =$$
$$-CDF_{r[n]}(x \mid d[n-m] = \bar{d}) \xrightarrow{for\ all\ x} E[r[n] \mid d[n-m] = \bar{d}]$$

where H( ) is a step function and x is the programmed threshold of the slicer.

The symmetry of the statistical distribution of r[n] can be employed to implement the calculation of CDF. Specifically, the linear combination of symmetrically distributed random variables usually is symmetric. Hence, if the uncorrelated random data (e.g., r[n]) are symmetrically distributed, then the desired expectation or conditional distribution is also symmetric. As the median and the expectation of a symmetrically distributed variable are equal, the threshold x that results in a CDF value of 0.5 is what needs to be measured by adjusting the threshold value of x at slicer 302 until an approximation of the CDF measured at 120 equals 0.5, as described below.

The impulse response estimation module 120 is thus configured to receive the threshold value x and "sliced" samples H(r[n]−x) from the slicer 302 to calculate the conditional average. Specifically, similar to the impulse response estimation module 120 is configured to obtain, from the decoder 103, a plurality of previously recovered transmitted data samples {d̂[k], k=0, 1, 2, . . . n} prior to a current time instance n. The impulse response estimation module 120 is then configured to select a first subset of a first plurality of slicer values {H(r[n]−x)|d[n−m]=d̄, n=1, 2, 3, . . . N} outputted from the first slicer 302 based on the plurality of previously recovered transmitted data samples {d̂[k], k=0, 1, 2, . . . n} that are used as equivalents of {d[k], k=0, 1, 2, . . . n} prior to a current time instance n. The impulse response estimation module 120 is configured to compute a first average of the first subset of the plurality of slicer values {H(r[n]−x)|d[n−m]=d̄, n=1, 2, 3, . . . N} as the conditional average $$\frac{1}{N} \sum_{\substack{n=0 \\ d[n-m]=\bar{d}}}^{N} H(r[n]-x).$$

The slicer 302 is then configured to receive the conditional average value 308 via a feedback loop, and then adjust the programmable threshold value x in order to achieve a conditional average value of 0.5, e.g., $$\frac{1}{N} \sum_{\substack{n=0 \\ d[n-m]=\bar{d}}}^{N} H(r[n]-x) = 0.5$$

When the conditional average achieves a value of 0.5, the corresponding threshold x approximates the value of d̄·p(τ+mT). Thus, similar to that in FIG. 2, the impulse response estimation module 120 is then configured to divide the computed conditional average by the value of the conditioned data sample d̄ to obtain a value of the channel estimate p(τ+mT).

The threshold point x that makes the CDF equal to 0.5 is considered to be the center of symmetry in the above computation. The calculation of CDF, however, can often be noisy. To increase the signal-to-noise ratio of the measured impulse response, the impulse response estimation module 120 is configured to condition on different values of d̄ to obtain measurements of the CDF at the 0.5 point. In another embodiment, the impulse response estimation module 120 is configured to use a CDF value different from 0.5 and also condition on different values of d̄. Further implementations of using different CDF values are discussed in FIGS. 4-5.

Figure 4:
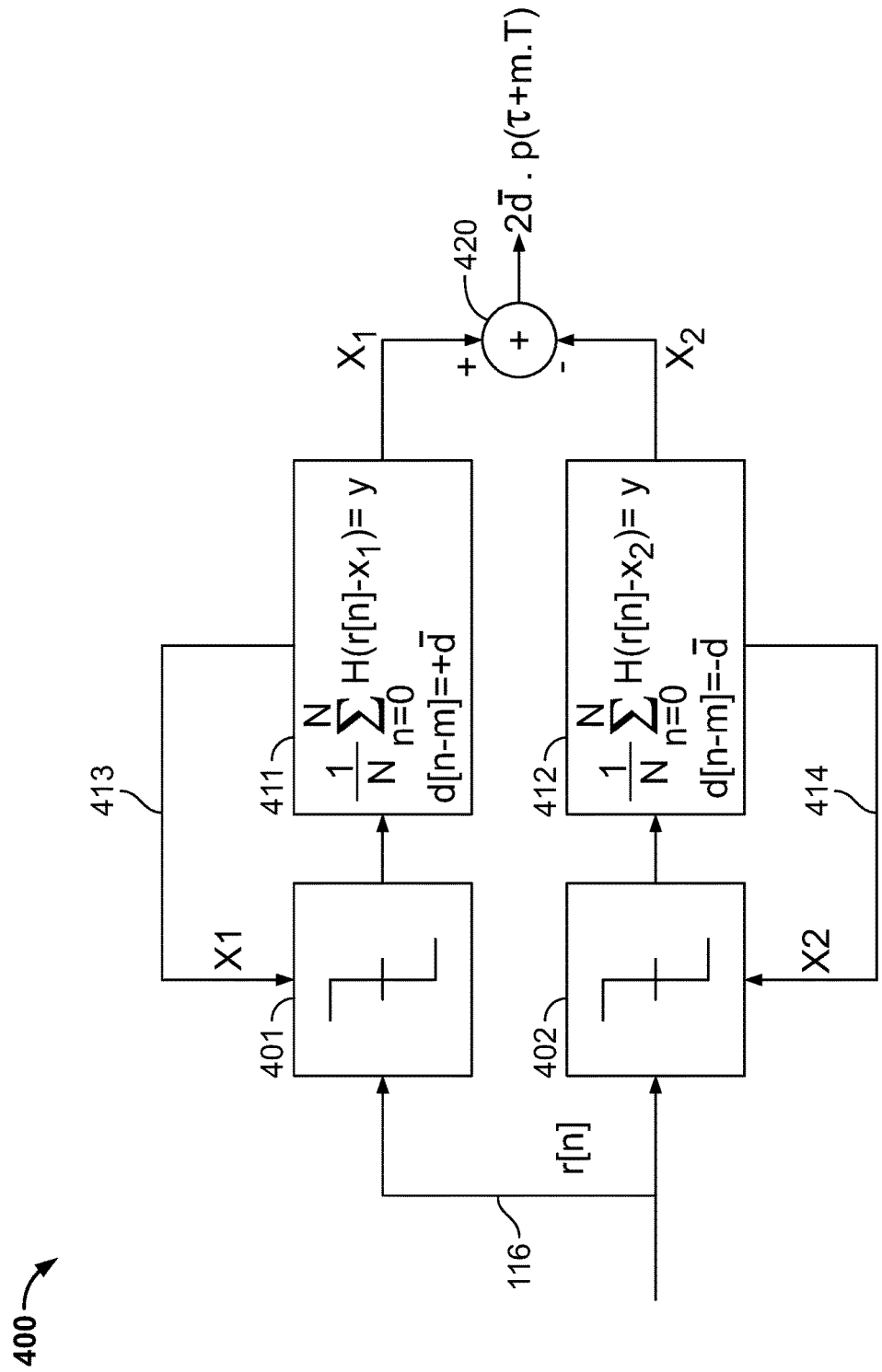
FIGS. 4-5 are example block diagrams illustrating alternative analog SerDes implementations of the network device receiver shown in FIG. 1, to measure a channel impulse response, according to embodiments described herein.
Figure 5:
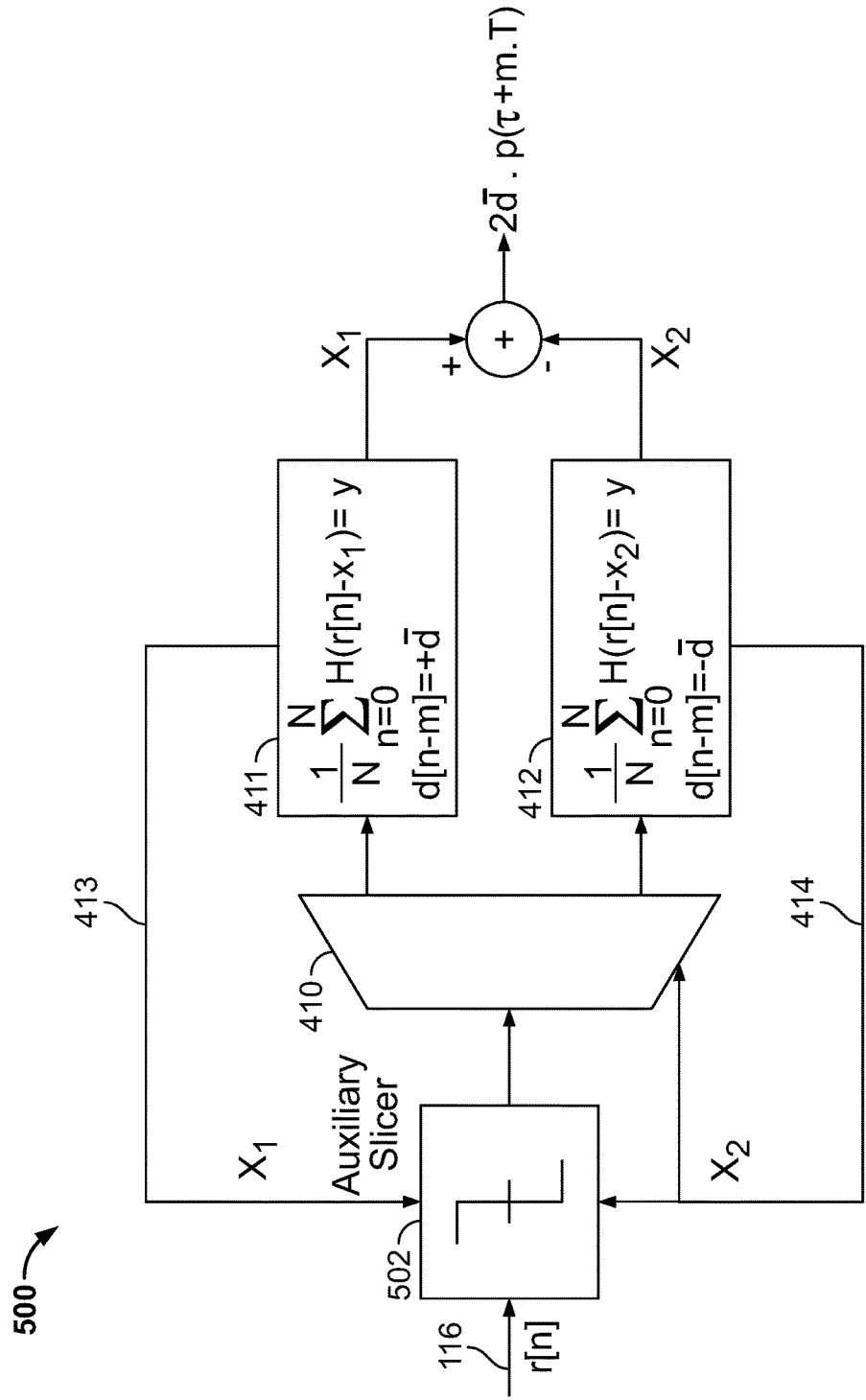

FIGS. 4-5 provide an example block diagrams 400 and 500, illustrating an analog SerDes implementation (e.g., similar to 300 in FIG. 4) using CDF values other than 0.5 to measure a channel impulse response, according to embodiments described herein. At diagram 400, two slicers, e.g., a first slicer 401 with a threshold of $x_1$ and a second slicer 402 with a threshold of $x_2$ are placed in parallel to operate on the data samples 116, e.g., r[n] obtained from the sampler 102 in FIG. 3. Two impulse response estimation modules 411 and 412 are connected to the slicers 401 and 402, respectively, wherein each of the two impulse response estimation modules 411 and 412 is configured to compute a conditional average value of the data samples from the respective slicer, conditioned on the opposite data sample values of d̄ and −d̄, respectively. Specifically, the impulse response estimation module 411 is configured to compute a first conditional average $$\frac{1}{N} \sum_{\substack{n=0 \\ d[n-m]=\bar{d}}}^{N} H(r[n]-x_1)$$

and the impulse response estimation module 412 is configured to compute:

$$\frac{1}{N} \sum_{\substack{n=0 \\ d[n-m]=\bar{d}}}^{N} H(r[n]-x_2)$$

each in a similar manner as the impulse response estimation module 120 calculates the conditional average of H(r[n]−x) in FIG. 3, wherein y is a value chosen between 0 and 1, e.g., a probability value. The impulse response estimation module 411 is configured to adjust the first threshold $x_1$ until the computed first average equals a probability value less than one, e.g., when $$\frac{1}{N} \sum_{\substack{n=0 \\ d[n-m]=\bar{d}}}^{N} H(r[n]-x_1) = y$$

is satisfied. Similarly, the impulse response estimation module 412 is configured to adjust the second threshold $x_2$ until the computed second average equals the probability value less than one, e.g., when $$\frac{1}{N} \sum_{\substack{n=0 \\ d[n-m]=\bar{d}}}^{N} H(r[n]-x_2) = y$$

is satisfied. For example, the impulse response estimation modules 411 and 412 are configured to adjust the values of thresholds $x_1$ and $x_2$ with the slicers 401 and 402 via the feedback loop 413 and 414, respectively, such that the corresponding conditional average values computed at 411 and 412 are both equal to the value y.

When both 411 and 412 compute a conditional average of the data samples equal to the value y, the thresholds of $x_1$ and $x_2$ are sent to an adder 420, which is configured to compute the difference between the respective threshold values of $x_2$ and $x_1$. The computed difference is indicative of 2 $\bar{d} \cdot p(\tau+mT)$. Thus, similar to the impulse response estimation module 120 in FIG. 2, the computed difference is divided by twice the value of the conditioned data sample $\bar{d}$ to obtain a value of the channel estimate $p(\tau+mT)$.

At diagram 500, instead of using two parallel slicers 401 and 402, a single slicer 502 is used to "slice" data samples r[n] 116 with a threshold value of $x_1$ or $x_2$, in a time-sharing manner. For example, the slicer 502 is configured to use the threshold of $x_1$ at an even number of time clock periods, and to use the threshold of $x_2$ at an odd number of time clock periods, in an embodiment. For a first subset of data samples that are received at the slicer 502 during the even number of time clock periods, the slicer 502 is configured to output a first respective slicer value of one when the magnitude of a first respective data sample is greater than the first threshold value $x_1$, and output the first respective slicer value of zero when the magnitude of the first respective data sample is less than the first threshold value $x_1$. For a second subset of data samples that are received at the slicer 502 during the odd number of time clock periods, the slicer 502 is configured to output a second respective slicer value of one when the magnitude of a second respective data sample is greater than the second threshold value $x_2$, and output the first respective slicer value of zero when the magnitude of the second respective data sample is less than the second threshold value $x_2$. The output of the slicer 502 is sent to a de-multiplexer 410, which is configured to de-multiplex the slicer output as $H(r[n]-x_1)$ and $H(r[n]-x_2)$ to send to impulse response estimation modules 411 and 412, respectively.

The impulse response estimation modules 411 and 412 are then configured to compute the conditional averages of the data samples r[n], e.g., $$\frac{1}{N} \sum_{\substack{n=0 \\ d[n-m]=\bar{d}}}^{N} H(r[n]-x_1)$$

and $$\frac{1}{N} \sum_{\substack{n=0 \\ d[n-m]=\bar{d}}}^{N} H(r[n]-x_2),$$

in a similar manner as described in relation to FIG. 4. For example, the impulse response estimation modules 411 and 412 are further configured to adjust the first threshold $x_1$ and the second threshold $x_2$ via the feedback loop to the slicer 502 until the computed first conditional average $$\frac{1}{N} \sum_{\substack{n=0 \\ d[n-m]=\bar{d}}}^{N} H(r[n]-x_1)$$

and the second conditional average $$\frac{1}{N} \sum_{\substack{n=0 \\ d[n-m]=\bar{d}}}^{N} H(r[n]-x_2)$$

are equivalent to a probability value y. The difference between the first threshold $x_1$ and the second threshold $x_2$ is then computed when the computed first conditional average and the second conditional average are equivalent to the probability value. The computed difference is divided by twice the value of the conditioned data sample $\bar{d}$ to obtain a value of the channel estimate $p(\tau+mT)$.

Figure 6:
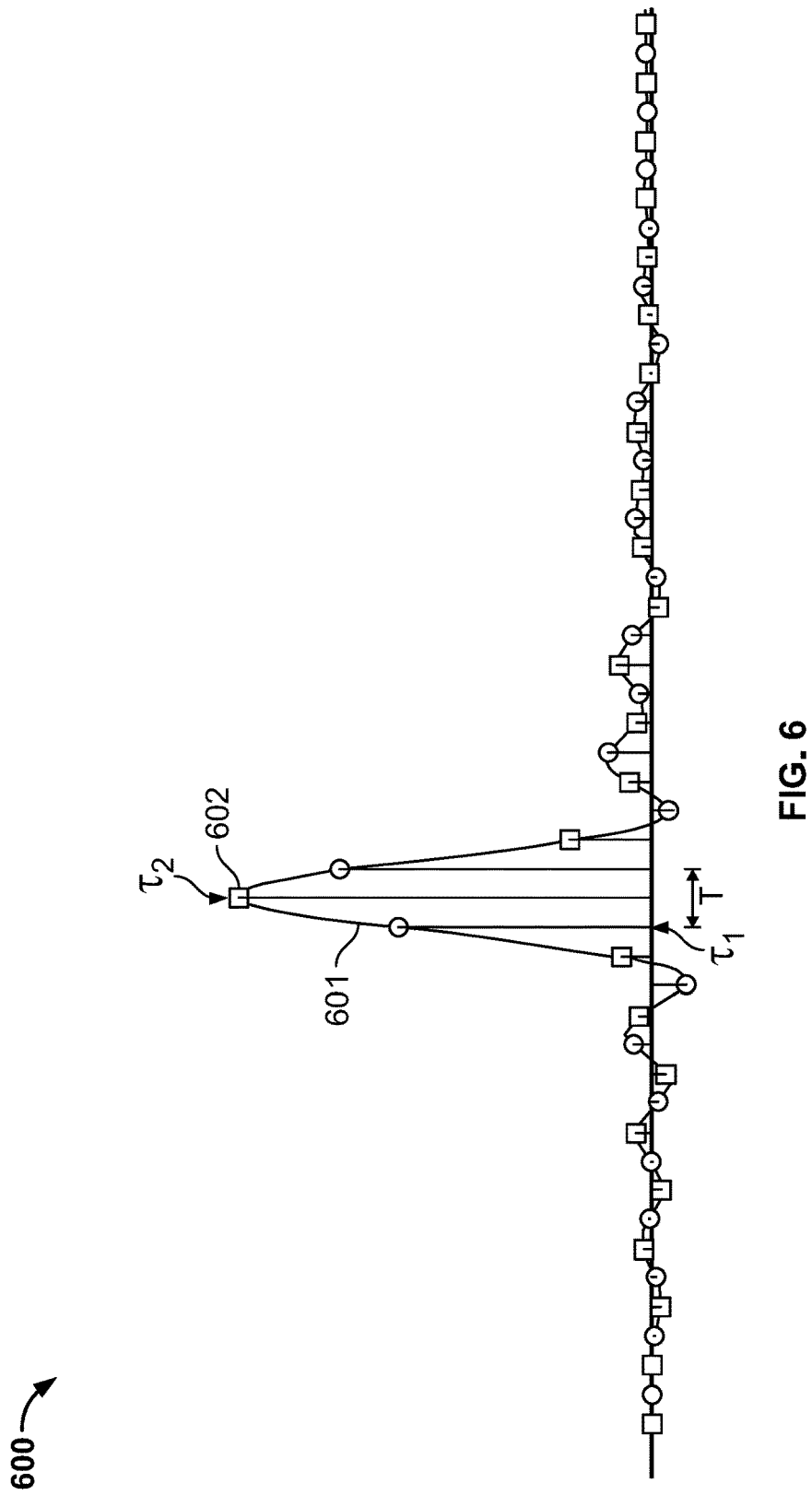
FIG. 6 is an example data plot diagram illustrating oversampled channel impulse responses using any of the circuits described in FIGS. 1-5, according to embodiments described herein.

FIG. 6 provides an example data plot diagram 600 illustrating oversampled impulse responses, according to embodiments described herein. As described in relation to FIGS. 1-5, a value of the channel estimate $p(\tau+mT)$ is obtained from the impulse response estimation module, wherein T is the sampling period, and $\tau$ represents a sampling time point. In some embodiments, at a fixed sampling time $\tau$, a sampled channel impulse response can be measured at a changing position of conditioned data sample with respect to the current one, e.g., d[n−m].

In some embodiments, different sampling times ($\tau_1$, $\tau_2$, . . . ) can be used to obtain different sampled impulse responses $p(\tau_1+mT)$, $p(\tau_2+mT)$, . . . , which are used to recover the oversample impulse response. For example, as shown at diagram 600, when the sampling period if T, using a sampling time of $\tau_1$ generates a set of channel impulse responses represented by the circle symbols 601. Using a sampling time of $\tau_2$ generates a set of channel impulse responses represented by the square symbols 602. Thus, by looping sampling times ($\tau_1$, $\tau_2$, . . . ), more sample points of the channel impulse response p(t) can be obtained to reconstruct the channel estimate for the decoder (e.g., 103 in FIGS. 1-3).

Figure 7:
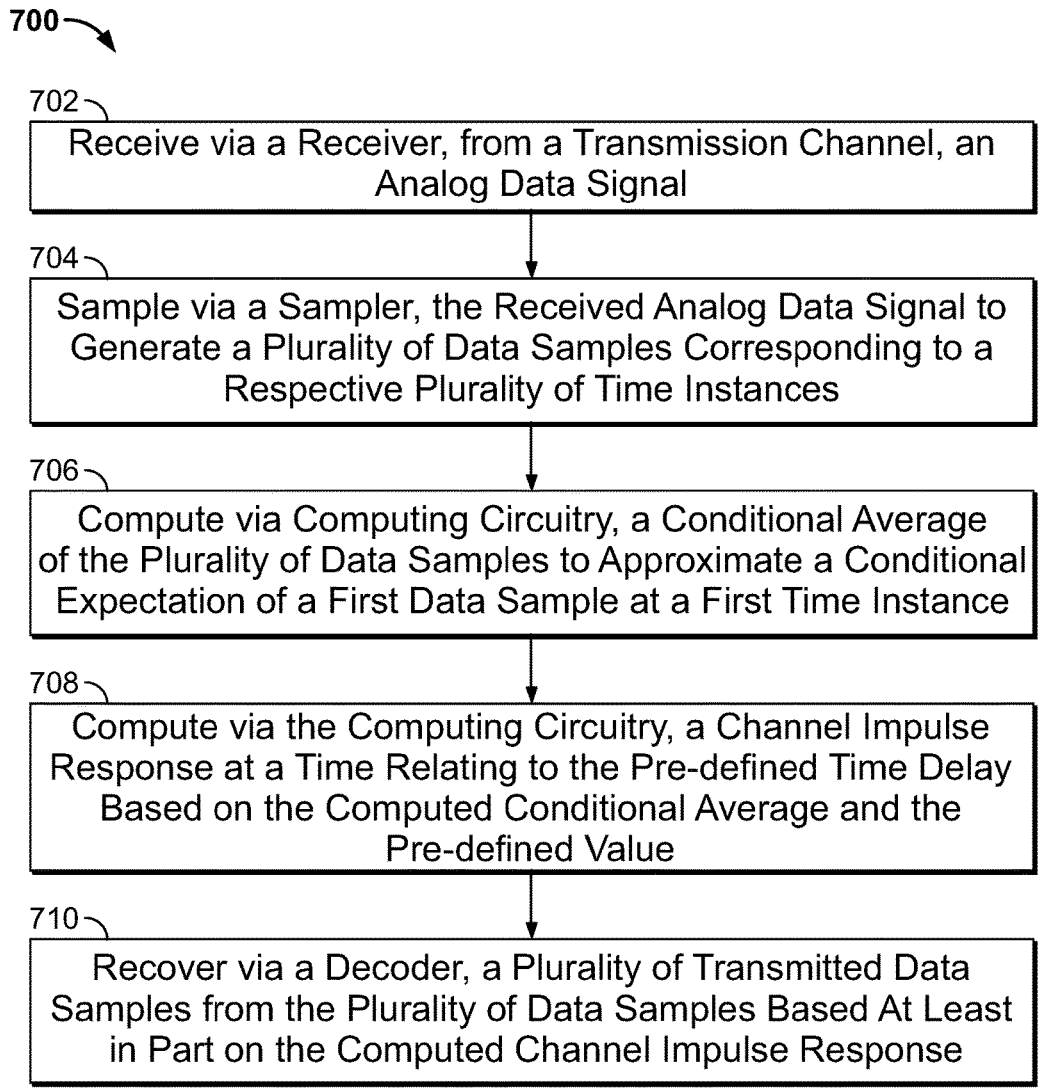
FIG. 7 is an example logic flow diagram illustrating techniques for measuring a channel impulse response based on statistical properties of digital data samples of the received signal using the circuit described in FIG. 1, according to embodiments described herein.

FIG. 7 provides an example logic flow diagram 700 illustrating an example work process of measuring a channel impulse response based on statistical properties of the received signal, according to embodiments described herein. Process 700 starts at 702, where a receiver network device (e.g., 101 in FIG. 1), receives, from a transmission channel, an analog data signal. At 704, the received analog data signal is sampled, via a sampler (e.g., 102 in FIGS. 1-3), to generate a plurality of data samples (e.g., 116 in FIGS. 1-3) corresponding to a respective plurality of time instances. At 706, a conditional average of the plurality of data samples is computed to approximate a conditional expectation of a first data sample at a first time instance. For example, for each data sample from the plurality of data samples, control circuitry at the receiver is configured to determine whether a given data sample from among the plurality of data samples satisfies a condition. The condition is that a transmitted data sample corresponding to the given data sample, when delayed by a pre-defined time delay, equals a pre-defined value, e.g., $d[n-m]=\bar{d}$ as discussed in relation to FIGS. 2-6. When the given data sample satisfies the condition, the given data sample is added into a subset of the plurality of data samples. The subset of the plurality of data samples are formed by examining each data sample from the plurality of data samples as described above. Then a mean average of the subset of the plurality of data samples is computed as a conditional average of the plurality of data samples. At 708, a channel impulse response is computed, via the computing circuitry, at a time relating to the pre-defined time delay based on the computed conditional average and the pre-defined value. For example, different circuit implementations to compute the conditional average and the channel impulse response are discussed throughout FIGS. 1-5. At 710, a plurality of transmitted data samples are recovered from the plurality of data samples based at least in part on the computed channel impulse response.

Various embodiments discussed in conjunction with FIGS. 1-7 are performed by various electronic components of one or more electronic circuits, such as but not limited to an integrated circuit, application-specific integrated circuit (ASIC), DSP, and/or the like. Various components discussed throughout this disclosure such as, but not limited to network devices (e.g., 101-102 in FIG. 1), and/or the like, are configured to include a set of electronic circuit components, and communicatively operate on one or more electronic circuits. Each electronic circuit is configured to include any of, but not limited to logic gates, memory cells, amplifiers, filters, and/or the like. Various embodiments and components disclosed herein are configured to be at least partially operated and/or implemented by processor-executable instructions stored on one or more transitory or non-transitory processor-readable media.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed to achieve the desirable results.

The subject matter of this specification has been described in terms of particular aspects, but other aspects can be implemented and are within the scope of the following claims. For example, the actions recited in the claims can be performed in a different order and still achieve desirable results. As one example, the process depicted in FIG. 7 does not necessarily require the particular order shown, or sequential order, to achieve desirable results. In certain implementations, multitasking and parallel processing may be advantageous. Other variations are within the scope of the following claims.

What is claimed is:

1. A network device configured to estimate a transmission attribute of a wired communications channel based on statistical properties of received data signals, without a specific training sequence, the network device comprising:
   a receiver configured to receive, from a transmission channel, an analog data signal;
   a sampler configured to sample the received analog data signal to generate a plurality of data samples corresponding to a respective plurality of time instances;
   computing circuitry configured to:
      determine whether a given data sample from among the plurality of data samples satisfies a condition, the condition being that a transmitted data sample corresponding to the given data sample, when delayed by a pre-defined time delay, equals a pre-defined value,
      when the given data sample satisfies the condition:
         add the given data sample into a subset of the plurality of data samples,
         compute a mean average of the subset of the plurality of data samples as a conditional average of the plurality of data samples;
      compute a channel impulse response at a time relating to the pre-defined time delay based on the computed conditional average and the pre-defined value; and
   a data recovery circuit configured to recover a plurality of transmitted data samples from the plurality of data samples based at least in part on the computed channel impulse response.

2. The network device of claim 1, further comprising an analog-to-digital converter (ADC) configured to convert the plurality of data samples into a digital data signal, and
   wherein the data recovery circuit is configured to recover the plurality of transmitted data samples from the digital data signal using the computed channel impulse response, and
   wherein the computing circuitry, when determining whether the transmitted data sample corresponding to the given data sample from among the plurality of data samples satisfies a condition, the condition being that the given data sample, when delayed by a pre-defined time delay, equals a pre-defined value, is further configured to:
   obtain, from the data recovery circuit, a plurality of previously recovered transmitted data samples prior to a current time instance;
   identify, from the plurality of previously recovered transmitted data samples, the transmitted data sample having a same time instance with the given data sample;
   obtain, from the plurality of previously recovered transmitted data samples, a delayed transmitted data sample that is delayed by a pre-defined time delay from the transmitted data sample; and
   determine whether the delayed transmitted data sample equals the pre-defined value.

3. The network device of claim 1, further comprising:
a first slicer configured to:
for each data sample from the plurality of data samples, compare a magnitude of the respective data sample with a first threshold value,
output a first respective slicer value of one when the magnitude of the respective data sample is greater than the first threshold value, and
output the first respective slicer value of zero when the magnitude of the respective data sample is less than the first threshold value; and
wherein the computing circuitry includes an analog serializer/deserializer (SerDes) circuit configured to:
obtain, from the data recovery circuit, a plurality of previously recovered transmitted data samples prior to a current time instance;
select a first subset of a first plurality of slicer values outputted from the first slicer based on the plurality of previously recovered transmitted data samples prior to a current time instance,
wherein each slicer value from the first subset corresponds to a respective time instance, and a respective transmitted sample at a time delayed by the pre-defined time delay relative to the respective time instance equals the pre-defined value; and
compute a first average of the first subset of the plurality of slicer values.

4. The network device of claim 3, wherein the first slicer is configured to:
receive the computed first average from the computing circuitry via a feedback loop; and
adjust the first threshold value until the computed first average equals a value of 0.5; and
wherein the computing circuitry is configured to compute the channel impulse response at the time relating to the pre-defined time delay by dividing the adjusted first threshold by the pre-defined value.

5. The network device of claim 3, further comprising:
a second slicer, disposed in parallel to the first slicer, the second slicer being configured to:
for each data sample from the plurality of data samples, compare the magnitude of the respective data sample with a second threshold value,
output a second respective slicer value of one when the magnitude of the respective data sample is greater than the second threshold value, and
output the second respective slicer value of zero when the magnitude of the respective data sample is less than the second threshold value,
wherein the computing circuitry, when computing the conditional average of the plurality of data samples, is further configured to:
select a second subset of a plurality of slicer values outputted from the second slicer based on the plurality of previously recovered transmitted data samples prior to the current time instance,
wherein each slicer value from the second subset corresponds to the respective time instance, and a respective transmitted sample at a time delayed by the pre-defined time delay relative to the respective time instance equals an opposite of the pre-defined value; and
compute a second average of the second subset of the plurality of slicer values.

6. The network device of claim 5, wherein the first slicer is configured to:
receive the computed first average from the computing circuitry via a first feedback loop, and
adjust the first threshold until the computed first average equals a probability value less than one;
wherein the second slicer is configured to:
receive the computed second average from the computing circuitry via a second feedback loop, and
adjust the second threshold until the computed second average equals the probability value; and
wherein the computing circuitry is further configured to:
compute a difference between the adjusted first threshold and the adjusted second threshold, and
compute the channel impulse response at the time relating to the pre-defined time delay by dividing the computed difference by the pre-defined value.

7. The network device of claim 1, further comprising:
a slicer configured to:
for a first subset of data samples from the plurality of data samples, output a first respective slicer value of one when the magnitude of a first respective data sample is greater than the first threshold value, and output the first respective slicer value of zero when the magnitude of the first respective data sample is less than the first threshold value;
for a second subset of data samples from the plurality of data samples, output a second respective slicer value of one when the magnitude of a second respective data sample is greater than the second threshold value, and output the first respective slicer value of zero when the magnitude of the second respective data sample is less than the second threshold value;
a de-multiplexer connected to the slicer, wherein the de-multiplexer is configured to demultiplex an output from the slicer into a first output of slicer values generated from the first subset of data samples, and a second output of slicer values generated from the second subset of data samples,
wherein the computing circuitry is configured to compute a first conditional average of the first output of slicer values given a first condition is met, and to compute a second conditional average of the second output of the slicer values given a second condition is met,
wherein the first condition is that for a first given data sample from the first subset of data samples, a first transmitted data sample corresponding to the first given data sample, when delayed by the pre-defined time delay, equals the pre-defined value, and
wherein the second condition is that for a second given data sample from the second subset of data samples, a second transmitted data sample corresponding to the second given data sample, when delayed by the pre-defined time delay, equals an opposite of the pre-defined value.

8. The network device of claim 7, wherein the computing circuitry is further configured to adjust the first threshold and the second threshold via a feedback loop to the slicer until the computed first conditional average and the second conditional average are equivalent to a probability value;
compute a difference between the first threshold and the second threshold when the computed first conditional average and the second conditional average are equivalent to the probability value; and
compute the channel impulse response based on the computed difference.

9. The network device of claim 1, wherein the sampler is configured to sample the received data signal at a sampling time point within a sampling period,
wherein the computed channel impulse response corresponds to the sampling time.

10. The network device of claim 1, wherein the sampler is configured to sample the received data signal at a set of different sampling times, each sampling time from the set of different sampling times corresponding to a different time point within a sampling period; and
wherein the computing circuitry is further configured to compute a set of different channel impulse responses corresponding to different sampling times based on data samples obtained at the set of different sampling times.

11. A method for estimating a transmission attribute of a wired communications channel without a specific training sequence, the method comprising:
receiving, via a receiver, from a transmission channel, an analog data signal;
sampling, via a sampler, the received analog data signal to generate a plurality of data samples corresponding to a respective plurality of time instances;
determining, via computing circuitry, whether a given data sample from among the plurality of data samples satisfies a condition, the condition being that a transmitted data sample corresponding to the given data sample, when delayed by a pre-defined time delay, equals a pre-defined value;
when the given data sample satisfies the condition:
adding the given data sample into a subset of the plurality of data samples, and
computing a mean average of the subset of the plurality of data samples as a conditional average of the plurality of data samples;
computing, via the computing circuitry, a channel impulse response at a time relating to the pre-defined time delay based on the computed conditional average and the pre-defined value; and
recovering, via a data recovery circuit, a plurality of transmitted data samples from the plurality of data samples based at least in part on the computed channel impulse response.

12. The method of claim 11, further comprising:
converting, via an analog-to-digital converter (ADC), the plurality of data samples to a digital data signal;
recovering, via the data recovery circuit, the plurality of transmitted data samples from the digital data signal using the computed channel impulse response; and
wherein the determining whether the transmitted data sample corresponding to the given data sample from among the plurality of data samples satisfies a condition further comprises:
obtaining, from the data recovery circuit, a plurality of previously recovered transmitted data samples prior to a current time instance;
identifying, from the plurality of previously recovered transmitted data samples, the transmitted data sample having a same time instance with the given data sample;
obtaining, from the plurality of previously recovered transmitted data samples, a delayed transmitted data sample that is delayed by a pre-defined time delay from the transmitted data sample; and
determining whether the delayed transmitted data sample equals the pre-defined value.

13. The method of claim 11, further comprising:
for each data sample from the plurality of data samples:
comparing, at a first slicer, a magnitude of the respective data sample with a first threshold value,
outputting, from the first slicer, a first respective slicer value of one when the magnitude of the respective data sample is greater than the first threshold value,
outputting, from the first slicer, the first respective slicer value of zero when the magnitude of the respective data sample is less than the first threshold value,
obtaining, at an analog serializer/deserializer (SerDes) circuit, from the data recovery circuit, a plurality of previously recovered transmitted data samples prior to a current time instance,
selecting a first subset of a first plurality of slicer values outputted from the first slicer based on the plurality of previously recovered transmitted data samples prior to a current time instance,
wherein each slicer value from the first subset corresponds to a respective time instance, and a respective transmitted sample at a time delayed by the pre-defined time delay relative to the respective time instance equals the pre-defined value; and
computing a first average of the first subset of the plurality of slicer values.

14. The method of claim 13, further comprising:
receiving, at the first slicer, the computed first average from the computing circuitry via a feedback loop; and
adjusting, at the first slicer, the first threshold value until the computed first average equals a value of 0.5; and
computing the channel impulse response at the time relating to the pre-defined time delay by dividing the adjusted first threshold by the pre-defined value.

15. The method of claim 13, further comprising:
for each data sample from the plurality of data samples,
comparing, at a second slicer disposed in parallel to the first slicer, the magnitude of the respective data sample with a second threshold value;
outputting, from the second slicer, a second respective slicer value of one when the magnitude of the respective data sample is greater than the second threshold value;
outputting, from the second slicer, the second respective slicer value of zero when the magnitude of the respective data sample is less than the second threshold value;
selecting a second subset of a plurality of slicer values outputted from the second slicer based on the plurality of previously recovered transmitted data samples prior to the current time instance;
wherein each slicer value from the second subset corresponds to the respective time instance, and a respective transmitted sample at a time delayed by the pre-defined time delay relative to the respective time instance equals an opposite of the pre-defined value; and
computing a second average of the second subset of the plurality of slicer values.

16. The method of claim 15, further comprising:
receiving, at the first slicer, the computed first average from the computing circuitry via a first feedback loop, and
adjusting, at the first slicer, the first threshold until the computed first average equals a probability value less than one;

receiving, at the second slicer, the computed second average from the computing circuitry via a second feedback loop; and adjusting, at the second slicer, the second threshold until the computed second average equals the probability value;

computing a difference between the adjusted first threshold and the adjusted second threshold; and computing the channel impulse response at the time relating to the pre-defined time delay by dividing the computed difference by the pre-defined value.

17. The method of claim 11, further comprising:

for a first subset of data samples from the plurality of data samples, outputting, at a slicer, a first respective slicer value of one when the magnitude of a first respective data sample is greater than the first threshold value, and outputting, from the slicer, the first respective slicer value of zero when the magnitude of the first respective data sample is less than the first threshold value;

for a second subset of data samples from the plurality of data samples:

outputting, from the slicer, a second respective slicer value of one when the magnitude of a second respective data sample is greater than the second threshold value, and outputting, from the slicer, the first respective slicer value of zero when the magnitude of the second respective data sample is less than the second threshold value;

demultiplexing, via a de-multiplexer connected to the slicer, an output from the slicer into a first output of slicer values generated from the first subset of data samples, and a second output of slicer values generated from the second subset of data samples;

computing a first conditional average of the first output of slicer values given a first condition is met, wherein the first condition is that for a first given data sample from the first subset of data samples, a first transmitted data sample corresponding to the first given data sample, when delayed by the pre-defined time delay, equals the pre-defined value; and computing a second conditional average of the second output of the slicer values given a second condition is met, wherein the second condition is that for a second given data sample from the second subset of data samples, a second transmitted data sample corresponding to the second given data sample, when delayed by the pre-defined time delay, equals an opposite of the pre-defined value.

18. The method of claim 17, further comprising:

adjusting the first threshold and the second threshold via a feedback loop to the slicer until the computed first conditional average and the second conditional average are equivalent to a probability value;

computing a difference between the first threshold and the second threshold when the computed first conditional average and the second conditional average are equivalent to the probability value; and computing the channel impulse response based on the computed difference.

19. The method of claim 11, further comprising:

sampling, via the sampler, the received data signal at a sampling time point within a sampling period, wherein the computed channel impulse response corresponds to the sampling time.

20. The method of claim 11, further comprising:

sampling, via the sampler, the received data signal at a set of different sampling times, each sampling time from the set of different sampling times corresponding to a different time point within a sampling period; and computing, via the computing circuitry, a set of different channel impulse responses corresponding to different sampling times based on data samples obtained at the set of different sampling times.

* * * * *